(12) United States Patent
Piner et al.

(10) Patent No.: US 8,343,824 B2
(45) Date of Patent: Jan. 1, 2013

(54) GALLIUM NITRIDE MATERIAL PROCESSING AND RELATED DEVICE STRUCTURES

(75) Inventors: Edwin Lanier Piner, Cary, NC (US); Jerry Wayne Johnson, Raleigh, NC (US); John Claassen Roberts, Hillsborough, NC (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 12/143,727

(22) Filed: Jun. 20, 2008

(65) Prior Publication Data
US 2009/0267188 A1 Oct. 29, 2009

Related U.S. Application Data

(60) Provisional application No. 61/048,940, filed on Apr. 29, 2008.

(51) Int. Cl.
*H01L 21/337* (2006.01)
*H01L 21/00* (2006.01)
*H01L 29/12* (2006.01)
*H01L 29/20* (2006.01)

(52) U.S. Cl. ............ 438/189; 438/45; 438/98; 438/334; 438/336; 438/370; 257/615; 257/E21.387; 257/E29.004; 257/E33.025; 257/E33.049

(58) Field of Classification Search .............. 257/613, 257/E21.001, E33.001, 54, 615, E21.387, 257/E33.025, E33.049, E29.004; 438/45, 438/189, 198, 334, 336, 370
See application file for complete search history.

(56) References Cited

U.S. PATENT DOCUMENTS

| 4,321,613 | A | * | 3/1982 | Hughes et al. ............... 257/270 |
| 4,843,440 | A |   | 6/1989 | Huang |
| 5,192,987 | A |   | 3/1993 | Khan et al. |
| 5,239,188 | A |   | 8/1993 | Takeuchi et al. |
| 5,290,393 | A |   | 3/1994 | Nakamura |
| 5,296,395 | A |   | 3/1994 | Khan et al. |
| 5,389,571 | A |   | 2/1995 | Takeuchi et al. |
| 5,393,993 | A |   | 2/1995 | Edmond et al. |
| 5,523,589 | A |   | 6/1996 | Edmond et al. |
| 5,633,192 | A |   | 5/1997 | Moustakas et al. |
| 5,679,965 | A |   | 10/1997 | Schetzina |
| 5,739,554 | A |   | 4/1998 | Edmond et al. |
| 5,741,724 | A |   | 4/1998 | Ramdani et al. |
| 5,760,426 | A |   | 6/1998 | Marx et al. |
| 5,786,606 | A |   | 7/1998 | Nishio et al. |
| 5,815,520 | A |   | 9/1998 | Furushima |
| 5,838,029 | A |   | 11/1998 | Shakuda |

(Continued)

FOREIGN PATENT DOCUMENTS
WO WO 2007/136401 A2 11/2007

OTHER PUBLICATIONS
International Search Report, from PCT/US09/02663, mailed Jul. 2, 2009.

(Continued)

*Primary Examiner* — Cheung Lee
*Assistant Examiner* — Jeremy Joy
(74) *Attorney, Agent, or Firm* — Farjami & Farjami LLP

(57) ABSTRACT

Gallium nitride material devices and related processes are described. In some embodiments, an N-face of the gallium nitride material region is exposed by removing an underlying region.

27 Claims, 11 Drawing Sheets

U.S. PATENT DOCUMENTS

| | | |
|---|---|---|
| 5,838,706 A | 11/1998 | Edmond et al. |
| 5,874,747 A | 2/1999 | Redwing et al. |
| 5,903,017 A | 5/1999 | Itaya et al. |
| 5,929,467 A | 7/1999 | Kawai et al. |
| 6,045,626 A | 4/2000 | Yano et al. |
| 6,051,849 A | 4/2000 | Davis et al. |
| 6,064,078 A | 5/2000 | Northrup et al. |
| 6,064,082 A | 5/2000 | Kawai et al. |
| 6,069,021 A | 5/2000 | Terashima et al. |
| 6,100,545 A | 8/2000 | Chiyo et al. |
| 6,120,600 A | 9/2000 | Edmond et al. |
| 6,121,121 A | 9/2000 | Koide |
| 6,139,628 A | 10/2000 | Yuri et al. |
| 6,146,457 A | 11/2000 | Solomon |
| 6,153,010 A | 11/2000 | Kiyoku et al. |
| 6,156,581 A | 12/2000 | Vaudo et al. |
| 6,177,688 B1 | 1/2001 | Linthicum et al. |
| 6,180,270 B1 | 1/2001 | Cole et al. |
| 6,201,262 B1 | 3/2001 | Edmond et al. |
| 6,255,198 B1 | 7/2001 | Linthicum et al. |
| 6,261,929 B1 | 7/2001 | Gehrke et al. |
| 6,261,931 B1 | 7/2001 | Keller et al. |
| 6,265,289 B1 | 7/2001 | Zheleva et al. |
| 6,291,319 B1 | 9/2001 | Yu et al. |
| 6,329,063 B2 | 12/2001 | Lo et al. |
| 6,380,108 B1 | 4/2002 | Linthicum et al. |
| 6,391,748 B1 | 5/2002 | Temkin et al. |
| 6,403,451 B1 | 6/2002 | Linthicum et al. |
| 6,420,197 B1 | 7/2002 | Ishida et al. |
| 6,426,512 B1 | 7/2002 | Ito et al. |
| 6,440,823 B1 | 8/2002 | Vaudo et al. |
| 6,441,393 B2 | 8/2002 | Goetz et al. |
| 6,459,712 B2 | 10/2002 | Tanaka et al. |
| 6,465,814 B2 | 10/2002 | Kasahara et al. |
| 6,486,502 B1 | 11/2002 | Sheppard et al. |
| 6,498,111 B1 | 12/2002 | Kapolnek et al. |
| 6,521,514 B1 | 2/2003 | Gehrke et al. |
| 6,524,932 B1 | 2/2003 | Zhang et al. |
| 6,548,333 B2 | 4/2003 | Smith |
| 6,583,034 B2 | 6/2003 | Ramdani et al. |
| 6,583,454 B2 | 6/2003 | Sheppard et al. |
| 6,586,781 B2 | 7/2003 | Wu et al. |
| 6,610,144 B2 | 8/2003 | Mishra et al. |
| 6,611,002 B2 | 8/2003 | Weeks et al. |
| 6,617,060 B2 | 9/2003 | Weeks et al. |
| 6,624,452 B2 | 9/2003 | Yu et al. |
| 6,649,287 B2 | 11/2003 | Weeks, Jr. et al. |
| 6,765,240 B2 | 7/2004 | Tischler et al. |
| 6,765,241 B2 | 7/2004 | Ohno et al. |
| 6,777,278 B2 | 8/2004 | Smith |
| 6,841,409 B2 | 1/2005 | Onishi |
| 6,849,882 B2 | 2/2005 | Chavarkar et al. |
| 6,991,953 B1 | 1/2006 | Bruner et al. |
| 7,071,498 B2 | 7/2006 | Johnson et al. |
| 7,135,720 B2 | 11/2006 | Nagy et al. |
| 7,161,194 B2 | 1/2007 | Parikh et al. |
| 7,233,028 B2 | 6/2007 | Weeks et al. |
| 7,247,889 B2 | 7/2007 | Hanson et al. |
| 7,352,016 B2 | 4/2008 | Nagy et al. |
| 7,566,579 B2* | 7/2009 | Watson et al. ............ 438/46 |
| 7,915,643 B2* | 3/2011 | Suh et al. ............ 257/194 |
| 2001/0042503 A1 | 11/2001 | Lo et al. |
| 2002/0020341 A1 | 2/2002 | Marchand et al. |
| 2002/0048918 A1* | 4/2002 | Grider et al. ............ 438/592 |
| 2002/0117695 A1 | 8/2002 | Borges |
| 2003/0064521 A1* | 4/2003 | Lu et al. ............ 436/55 |
| 2003/0136333 A1 | 7/2003 | Semond et al. |
| 2004/0130002 A1 | 7/2004 | Weeks et al. |
| 2005/0145851 A1 | 7/2005 | Johnson et al. |
| 2005/0167775 A1 | 8/2005 | Nagy et al. |
| 2005/0285141 A1 | 12/2005 | Piner et al. |
| 2005/0285142 A1 | 12/2005 | Piner et al. |
| 2006/0006500 A1 | 1/2006 | Piner et al. |
| 2006/0108602 A1* | 5/2006 | Tanimoto ............ 257/192 |
| 2006/0138566 A1 | 6/2006 | Chakravarti et al. |
| 2007/0042560 A1 | 2/2007 | Sumiya et al. |
| 2007/0111345 A1 | 5/2007 | Wong et al. |
| 2007/0121690 A1 | 5/2007 | Fujii et al. |
| 2007/0215982 A1 | 9/2007 | Koukitu et al. |
| 2008/0001165 A1 | 1/2008 | Hashimoto et al. |
| 2008/0026487 A1* | 1/2008 | Feustel et al. ............ 438/7 |
| 2009/0072272 A1* | 3/2009 | Suh et al. ............ 257/194 |
| 2009/0075469 A1* | 3/2009 | Furman et al. ............ 438/613 |
| 2009/0085065 A1* | 4/2009 | Mishra et al. ............ 257/194 |

OTHER PUBLICATIONS

Chini, A., et al., "Fabrication and Characterization of N-Face AlGaN/GaN/AlGaN HEMTs", 2005 IEEE, pp. 63-64.

Fong, W. et al., "Study of Low-Frequency Excess Noise Transport in Ga-Face and N-Face GaN Thin Films Grown on Intermediate-Temperature Buffer Layer by RF-MBE", phys. stat. sol. (a) 192, No. 2, 466-471 (2002).

Gao, Y., et al., "Optimization of AlGaN/GaN current aperture vertical electron transistor (CAVET) fabricated by photoelectrochemical wet etching", University of California Postprints, 2004, Paper 51.

Kwak, J. et al., "Al-Based Contacts on Ga-face and N-face n-GaN Wafer Grown by Using Hydride Vapor Phase Epitaxy", Journal of the Korean Physical Society, vol. 48, No. 6, Jun. 2006, pp. 1259-1263.

Li, N. et al., "Polarization effects simulation of AlGaN/GaN herterojunction by using a symbolistic §-doping layer", Solid State Communications 132 (2004) 701-705.

Murphy, M. et al., "Normal and Inverted ALGAN/GAN Based Piezoelectric Field Effect Transistors Grown by Plasma Induced Molecular Beam Epitaxy", MRS Internet J. Nitride Semicond. Res. 4S1, G8.4(1999).

Neuberger, R. et al., "Observation of ion-induced changes in the channel current of high electron mobility AlGaN/GaN transistors (HEMT)", Materials Science and Engineering B93 (2002) 143-146.

Rajan, S. et al., "Growth and Electrical Characterization of N-face AlGaN/GaN Heterostructures", Japanese Journal of Applied Science, vol. 44, No. 49, 2005, pp. L 1478-L 1480.

Speck, J.. et al., "High Efficiency Nitride-Based Photonic Crystal Light Sources", UCSB, Materials Department, University of CA, Santa Barbara, CA.

Sumiya, M. et al., "Growth mode and surface morphology of a GaN film deposited along the N-face polar direction on c-plane sapphire substrate", Journal of Applied Physics, vol. 88, No. 2, Jul. 15, 2000, p. 1158-1165.

Winders, J. et al., "Characterization of Semipolar, and N-Face Group III Nitrides", 2005 NNIN REU Research Accomplishments, pp. 158-159.

Wong, M. et al., "N-face high electron mobility transistors with a GaN-spacer", phys. stat. sol. (a) 204, No. 6, 2049-2053 (2007).

* cited by examiner

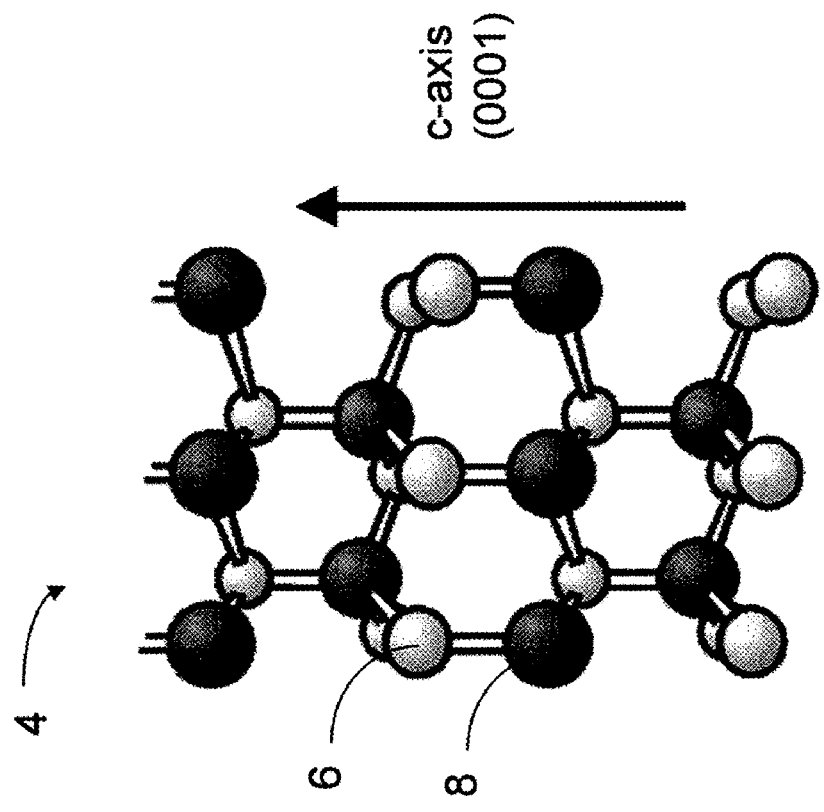
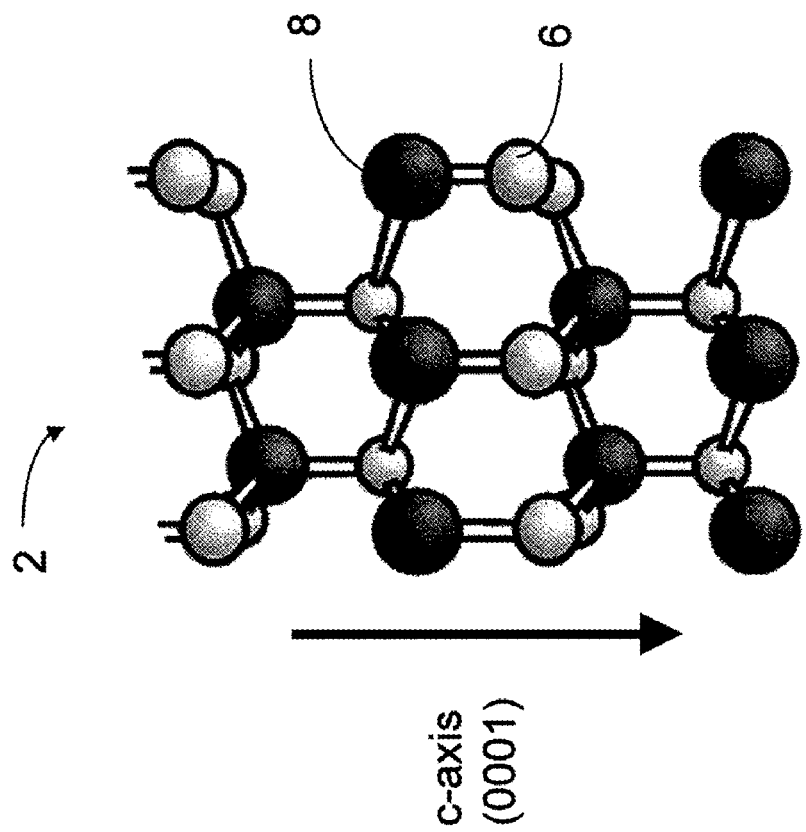

GALLIUM NITRIDE MATERIAL PROCESSING AND RELATED DEVICE STRUCTURES

RELATED APPLICATIONS

This application claims priority to U.S. Provisional Patent Application Ser. No. 61/048,940, which was filed on Apr. 29, 2008, and is incorporated herein by reference.

FIELD OF INVENTION

The present invention generally relates to gallium nitride material devices as well as related processes.

BACKGROUND OF INVENTION

Gallium nitride materials include gallium nitride (GaN) and its alloys such as aluminum gallium nitride (AlGaN), indium gallium nitride (InGaN), and aluminum indium gallium nitride (AlInGaN). These materials are semiconductor compounds that have a relatively wide, direct bandgap which permits highly energetic electronic transitions to occur. Such electronic transitions can result in gallium nitride materials having a number of attractive properties including the ability to efficiently emit blue light, the ability to transmit signals at high frequency, and others. Accordingly, gallium nitride materials are being widely investigated in many microelectronic applications such as transistors, field emitters, sensors (e.g., chemical, biological, and radiological in nature), and optoelectronic devices.

In general, the crystal structure of a gallium nitride material includes an arrangement of nitrogen atoms, (which also may be replaced in certain sites by other Group V elements such as B, As, P, Sb), and gallium atoms (which also may be replaced in certain sites by other Group III metals such as Al, In) in a (0001) crystallographic orientation. The nitrogen atoms are typically arranged in a series of planes in the structure; and, the gallium atoms are also arranged in a series of different planes. As disclosed herein, the "face" of a crystal structure is defined by the atomic bonding arrangement within a plane of atoms (e.g., a plane of nitrogen atoms, or a plane of gallium atoms). It should be understood that in this context, a "plane" of atoms may generally approximate a planar arrangement but need not be arranged in an ideal plane.

As shown in FIGS. 1A and 1B, if a plane of nitrogen atoms 6 is oriented with bonds along the c-axis at the topside of the crystal structure, the plane is referred to as an N-face 2; and, if a plane of gallium atoms 8 is oriented with bonds along the c-axis at the topside of the crystal structure, the plane is referred to as a Ga-face.

Thermodynamic considerations typically result in the top surface of a gallium nitride material layer having a gallium-face. Thus, features (e.g., layer(s)) formed on top of such gallium nitride material layers are formed on the gallium-face.

SUMMARY OF INVENTION

Gallium nitride material devices and related processes are described.

In one set of embodiments, a method of forming a gallium nitride material device structure is provided. The method comprises forming a gallium nitride material region on an underlying region, removing the underlying region to expose an N-face of the gallium nitride material region; and forming a feature on the N-face of the gallium nitride material region.

In another set of embodiments, a method is provided. The method comprises introducing a species within a structure comprising a gallium nitride material region and a region underlying the gallium nitride material region. The method further comprises removing a portion of the structure; and, stopping removal of the structure based on detection of the introduced species.

In another set of embodiments, a gallium nitride material device is provided. The device comprises a structure; and a single gallium nitride material region formed on the structure and having a thickness between 100 Angstroms and 500 Angstroms. The device does not include other gallium nitride material regions.

In another set of embodiments, a gallium nitride material device is provided. The device comprises a structure, a gallium nitride material formed on the structure and an implanted region formed, in part, within the gallium nitride material region. The device further comprises a feature formed on an N-face of the gallium nitride material region.

In another set of embodiments, a gallium nitride material device is provided. The device comprises a structure and a gallium nitride material region formed on the structure. The gallium nitride material region includes a GaN layer and an $Al_xGa_{(1-x)}N$ layer, wherein a ratio between a thickness of the GaN layer and a thickness of the $Al_xGa_{(1-x)}N$ layer is less than or equal to 1.

For purposes of clarity, not every component is labeled in every figure. Nor is every component of each embodiment of the invention shown where illustration is not necessary to allow those of ordinary skill in the art to understand the invention. All patent applications and patents incorporated herein by reference are incorporated by reference in their entirety. In case of conflict, the present specification, including definitions (if any), will control.

BRIEF DESCRIPTION OF THE DRAWINGS

FIG. 1A is a schematic of an N-face crystal according to embodiments illustrated herein;

FIG. 1B is a schematic of a Ga-face crystal according to embodiments illustrated herein;

DETAILED DESCRIPTION

Semiconductor device structures comprising a gallium nitride material region and methods associated with such structures are described. The methods can involve forming one or more features (e.g., layer(s)) on the N-face of the gallium nitride material region. As described further below, the methods can involve removing an underlying region to expose an N-face of the gallium nitride material region on which the features may be formed. Such methods can have advantages over conventional techniques that form features (e.g., layer(s)) on the Ga-face including tailoring electrical properties of the resulting device and improving thermal conduction near to a gallium nitride material active region which can enable greater power density and tighter packing density. Additionally, such methods can have advantages over conventional techniques that directly form gallium nitride material having an N-face upper surface through epitaxial growth. The advantages include the ability to form smoother surfaces and interfaces, as well as improving thermal conduction near to a gallium nitride material active region. The methods enable formation of high quality devices and, in particular, transistors (e.g., FETs) and diodes (e.g., LEDs and LDs).

When a feature (e.g., layer, contact) is referred to as being "on", "over" or "overlying" another feature (e.g., layer or substrate), it can be directly on the feature, or an intervening feature (e.g., layer) also may be present. A feature that is "directly on" another feature means that no intervening feature is present. It should also be understood that when a feature is referred to as being "on", "over" or "overlying" another feature, it may cover the entire feature, or a portion of the feature.

FIGS. 2A-9 illustrate a cross-section of the device structure after respective steps of a representative method have been performed.

Figure 2A:
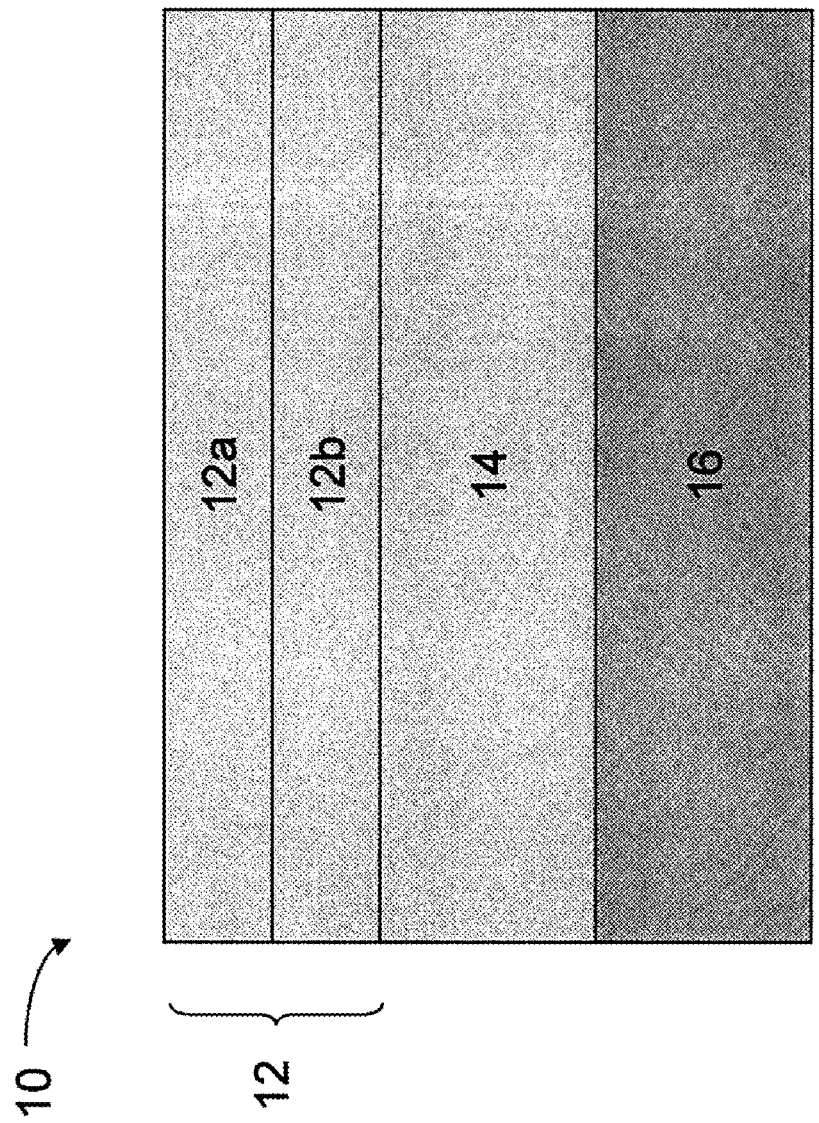
FIG. 2A is a schematic of gallium nitride material layers on a substrate according to embodiments illustrated herein.

FIG. 2A shows a structure 10 including a gallium nitride material region 12 prior to the step of exposing the N-face of the region. The gallium nitride material region is formed on a buffer region 14 buffer region which is formed on a substrate 16. In this embodiment, a number of regions (i.e., buffer region 14, substrate 16, etch stop layer 18) may underlie the gallium nitride material region 12. However, it should be understood that other embodiments may include a different number of underlying regions including, in some cases, a single underlying region.

As used herein, the phrase "gallium nitride material" refers to gallium nitride (GaN) and any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphoride nitride ($GaAs_aP_bN_{(1-a-b)}$), aluminum indium gallium arsenide phosporide nitride ($Al_xIn_yGa_{(1-x-y)}As_aP_bN_{(1-a-b)}$), amongst others. Typically, when present, arsenic and/or phosphorous are at low concentrations (i.e., less than 5 weight percent). In certain preferred embodiments, the gallium nitride material has a high concentration of gallium and includes little or no amounts of aluminum and/or indium. In high gallium concentration embodiments, the sum of (x+y) may be less than 0.4, less than 0.2, less than 0.1, or even less. In some cases, it is preferable for the gallium nitride material layer to have a composition of GaN (i.e., x=0, y=0). Gallium nitride materials may be doped n-type or p-type, or may be intrinsic. Suitable gallium nitride materials have been described in U.S. Pat. No. 6,649,287, incorporated by reference above.

In the illustrated embodiment, gallium nitride material region 12 includes a first gallium nitride material layer 12a and a second gallium nitride material layer 12b. In other cases, the gallium nitride material region may include a single gallium nitride material layer or more than two gallium nitride material layers. For example, in some embodiments, gallium nitride material region may include a GaN layer on top of the first gallium nitride material layer 12a. This GaN layer may be, for example, very thin with a thickness of less than 50 nm, or less than 25 nm.

In certain embodiments, it may be preferable for the gallium nitride material of the first layer (i.e., 12a) to have an aluminum concentration that is greater than the aluminum concentration of the gallium nitride material of the second layer (i.e., 12b). For example, the value of x in the gallium nitride material of first layer (with reference to any of the gallium nitride materials described above) may have a value that is between 0.05 and 1.0 greater than the value of x in the gallium nitride material of second layer, or between 0.1 and 0.5 greater than the value of x in the gallium nitride material of the first layer. For example, the second layer may be formed of $Al_{0.26}Ga_{0.74}N$, while the first layer is formed of GaN. This difference in aluminum concentration may lead to formation of a highly conductive region at the interface of the layers (i.e., a 2-D electron gas region).

In certain preferred embodiments, substrate 16 is a silicon substrate. As used herein, a silicon substrate refers to any substrate that includes a silicon surface. Examples of suitable silicon substrates include substrates that are composed entirely of silicon (e.g., bulk silicon wafers), silicon-on-insulator (SOI) substrates, silicon-on-sapphire substrate (SOS), silicon-on-diamond (SOD), and SIMOX substrates, amongst others. Suitable silicon substrates may also include substrates that have a silicon wafer bonded to another material such as diamond, AlN, or other polycrystalline materials. Silicon substrates having different crystallographic orientations may be used, though single crystal silicon substrates are preferred. In some cases, silicon (111) substrates are preferred. In other cases, silicon (100) substrates are preferred. In some embodiments, silicon substrates having a relatively high resistivity are preferred. For example, in some cases, the silicon substrate has a resistivity of greater than 10 kohm-cm.

It should be understood that other types of substrates may also be used including sapphire, silicon carbide, indium phosphide, silicon germanium, gallium arsenide, gallium nitride, aluminum nitride, or other III-V compound substrates. However, in embodiments that do not use silicon substrates, all of the advantages associated with silicon substrates may not be achieved. In some embodiments, it may be preferable to use non-nitride material-based substrates such as silicon, sapphire, silicon carbide, indium phosphide, silicon germanium and gallium arsenide.

The substrate may have any suitable dimensions. Suitable diameters include, but are not limited to, about 2 inches (or 50 mm), 4 inches (or 100 mm), 6 inches (or 150 mm), and 8 inches (or 200 mm). In some embodiments, it may be preferable to use a silicon substrate having relatively large diameters of at least about 4 inches (or 100 mm) or at least about 6 inches (or 150 mm), or at least about 8 inches (or 200 mm). In some cases, it may be preferable for the substrate to be relatively thick, such as greater than about 125 micron (e.g., between about 125 micron and about 800 micron, or between about 400 micron and 800 micron). Relatively thick substrates may be easy to obtain, process, and can resist bending which can occur, in some cases, in thinner substrates. In other embodiments, thinner substrates (e.g., less than 125 microns) are used, though these embodiments may not have the advantages associated with thicker substrates, but can have other advantages including facilitating processing and/or reducing the number of processing steps. In some processes, the substrate initially is relatively thick (e.g., between about 200 microns and 800 microns) and then is thinned during a later processing step (e.g., to less than 150 microns).

In some preferred embodiments, the substrate is substantially planar. Substantially planar substrates may be distinguished from substrates that are textured and/or have trenches formed therein (e.g., as in U.S. Pat. No. 6,265,289). As shown, the layers/regions of the device may also be substantially planar in the final device or structure. As described further below, such layers/regions may be grown in vertical (e.g., non-lateral) growth processes. Planar substrates and layers/regions can be advantageous in some embodiments, for example, to simplify processing. Though it should be understood that, in some embodiments of the invention, lateral growth processes may be used, as described further below, which may use textured substrates.

As shown, the device also includes buffer region 14 formed between the substrate 16 and the gallium nitride material region 12. The buffer region may include a number of different portions. The portions may have different compositions and/or different functions. For example, the a portion of the buffer region may promote absorption of strain which can enable high quality gallium nitride material to be deposited on the substrate. Such a portion may be a strain-absorbing layer formed on the substrate. A suitable strain-absorbing layer that may be incorporated in the buffer region has been described in commonly-owned U.S. Pat. No. 7,339,205 which is incorporated herein by reference in its entirety. In some embodiments, such a strain absorbing layer may be formed of a silicon nitride based material.

It may be preferred for the buffer region to include a portion formed of a compositionally-graded material (e.g., a compositionally-graded nitride-based material). This portion may, for example, be formed on the strain-absorbing portion. Suitable compositionally-graded layers have been described in commonly-owned U.S. Pat. No. 6,649,287 which is incorporated herein by reference in its entirety. According to one set of embodiments, the buffer region is compositionally-graded and formed of an alloy of gallium nitride such as $Al_xIn_yGa_{(1-x-y)}N$, $Al_xGa_{(1-x)}N$, and $In_yGa_{(1-y)}N$. In these embodiments, the concentration of at least one of the elements (e.g., Ga, Al, In) of the alloy is varied across at least a portion of the thickness of the buffer region. In certain preferred embodiments, it is desirable for the buffer region to have a low gallium concentration at a back surface which is graded to a high gallium concentration at a front surface. It has been found that such buffer regions are particularly effective in relieving internal stresses within gallium nitride material region 12. For example, the buffer region may have a composition of $Al_xGa_{(1-x)}N$, where x is decreased from the back surface to the front surface of the buffer region (e.g., x is decreased from a value of 1 at the back surface of the buffer region to a value of 0 at the front surface of the buffer region).

In some embodiments, the buffer region may include an additional portion that is formed of a gallium nitride material. This portion may be formed on the transition layer and/or directly beneath the second gallium nitride material layer 12b. In some cases, this portion is formed of a material substantially similar to that of second gallium nitride material layer 12b.

Figure 2B:
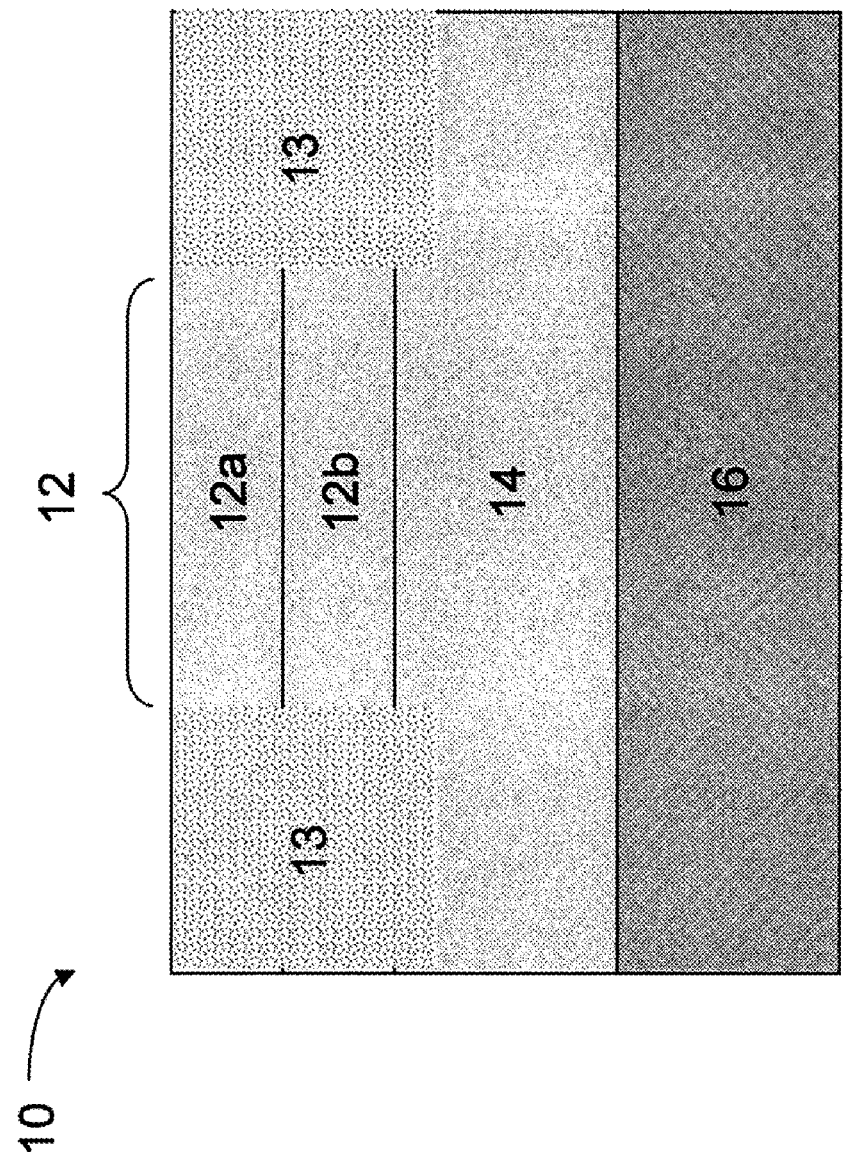
FIG. 2B is a schematic of gallium nitride material layers on a substrate with implanted regions in the gallium nitride layers according to embodiments illustrated herein.

It should be understood that the buffer region may have a different construction than that described above. It may include any number of portions, including a single portion. In some embodiments, as shown in FIG. 2B, implanted regions 13 may be incorporated in gallium nitride material region 12. In this respect, the implanted regions may be formed according to any suitable implantation technique. In some embodiments, ion implantation may be used to form the implanted regions by implanting species (e.g., ions). Suitable implantation conditions would be known to those of ordinary skill in the art. Accordingly, upon implantation of the species, local properties within gallium nitride material region 12 may exhibit different electrical properties than prior to implantation (e.g., increased electrical conduction in the vicinity of implant). Such implants are generally located so as not to negatively effect performance of the resulting device. Implanted regions may include any suitable implanted species such as for example, silicon, argon, and nitrogen, amongst others. Combinations of appropriate species may be used for implanted regions as well. As described further below, the implanted regions may facilitate stopping the underlying region removal step at an appropriate time.

As shown, the implanted regions are formed in part within the gallium nitride material region and extend into other portions of the structure. In some cases, the implanted regions are formed entirely within the gallium nitride material region. In some cases, the implanted regions are formed entirely outside the gallium nitride material region. The positioning of the implanted regions depends on the process and may relate to when it is desired to stop the underlying region removal step.

The process steps shown in FIGS. 3-9 refer to the embodiment depicted by FIG. 2A. It should be understood that appropriately similar steps appreciated by one of ordinary skill in the art can be performed for other embodiments, such as for example, those depicted by FIGS. 2B and 2C.

Figure 3:
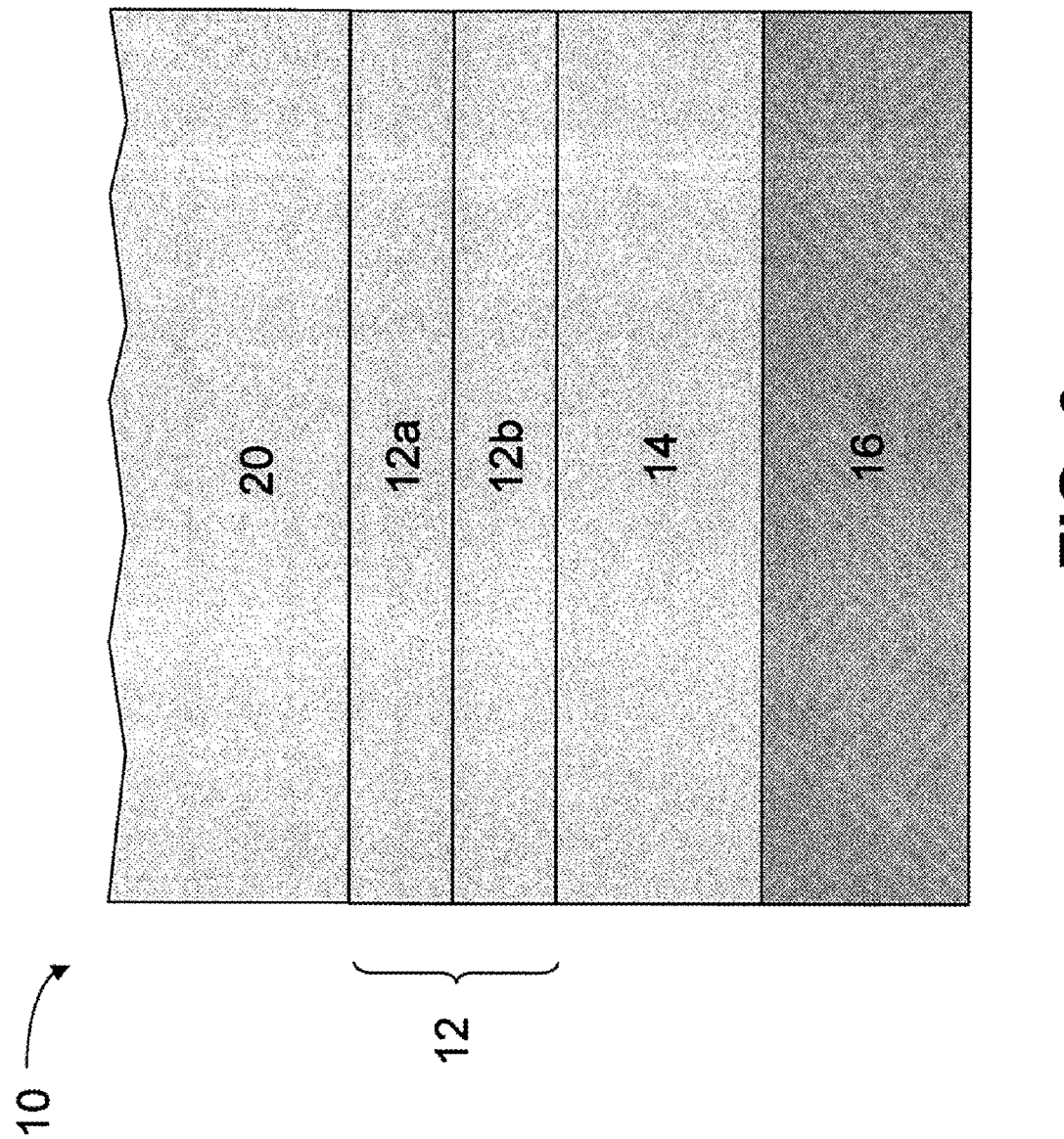
FIG. 3 is a schematic of a handle on gallium nitride material layers according to embodiments illustrated herein.

Referring to FIG. 3, for the embodiment shown in FIG. 2A a handle 20 is provided on the gallium nitride material region 12. The handle 20 may be deposited on or bonded to the gallium nitride material region 12 by any suitable technique known in the art. In some embodiments, the handle 20 may be deposited through chemical vapor deposition. In other embodiments, the handle 20 may be epitaxially grown.

In some embodiments, a thin passivation layer (not shown) may be formed in between the handle 20 and the gallium nitride material region 12. For some cases, the thin passivation layer may be formed of silicon nitride or any other appropriate material. In some embodiments, a thin passivation layer may exhibit a thickness between 1-100 nm. In other embodiments, a thin passivation layer may exhibit a thickness between 2-20 nm. In further embodiments, a thin passivation layer may exhibit a thickness between 3-10 nm.

Additionally, the handle 20 may be made up of any suitable material, such as, for example, diamond, gallium arsenide, indium phosphide, germanium, silicon, glass, sapphire, carbon nanotubes, or the like, as well as any combination thereof. For example, the handle 20 could be formed from two or more regions of different material. In some embodiments, the handle 20 may be formed in a multi-layered configuration. For some preferred embodiments, the majority of handle 20 may be formed of diamond.

In one aspect, materials used for the handle may allow for added performance enhancement of the device. In some embodiments, the handle material may provide added properties for heat transfer. For example, the handle may exhibit a relatively high thermal conductivity. In other embodiments, the handle material may provide for an integrating layer for easier incorporation of layers into the overall device. In further embodiments, the handle material may have a low loss tangent, providing for a beneficial frequency response.

In some cases, the handle may be selectively deposited and/or patterned for the formation of vias and saw streets, for example. In this regard, conductive materials formed in vias may provide for an electrically conductive pathway from interconnects and contact pads to active areas of the device, such as, for example, source, gate and drain electrodes. Vias may have any suitable dimensions and shape. The cross-sectional profile of the via may be square, rectangular, spherical, triangular, or the like. The via may have the same cross-sectional profile throughout the via, or may have a cross-sectional area which changes (e.g., increases, decreases) at any point along the depths of the via. Saw streets may also be formed for portions of the wafer to be efficiently divided into separate device components.

Figure 4:
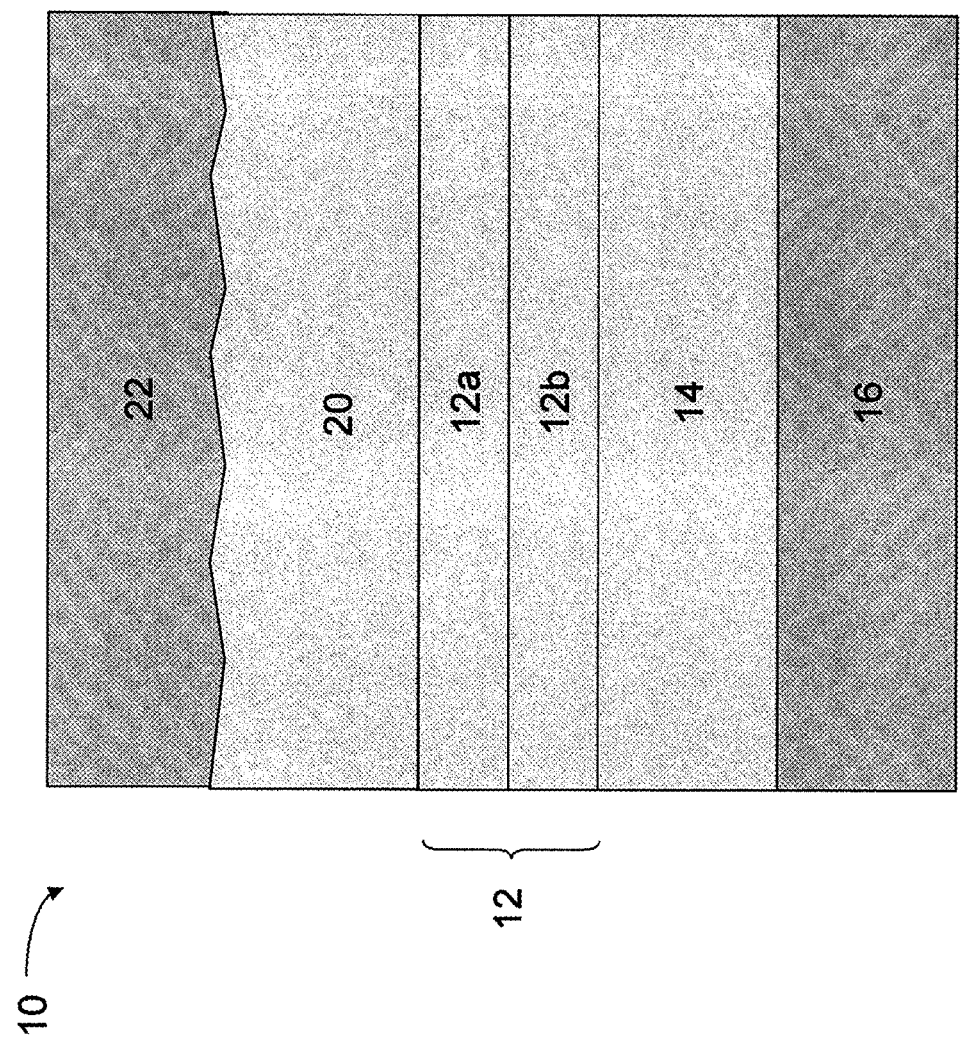
FIG. 4 is a schematic of a sacrificial handle portion deposited on a handle according to embodiments illustrated herein.

In FIG. 4, a sacrificial handle portion 22 is formed on the handle 20. In this respect, sacrificial handle portion 22 may facilitate handling of the structure in future processing steps, but may be removed so that it is not a portion of the final device.

The sacrificial handle portion 22 may be made from any suitable material, such as for example, but not limited to silicon, diamond, sapphire, silicon carbide, or glass. In some preferred embodiments, sacrificial handle portion 22 may be formed of silicon. In some embodiments, the sacrificial portion 22 is formed of the same material as handle 20. In these embodiments, the sacrificial portion may be part of the handle. However, in other embodiments, the sacrificial portion may be a separate portion attached to the handle.

The sacrificial handle portion 22 may be attached through any suitable technique. In some embodiments, sacrificial handle portion 22 is formed through chemical vapor deposition. In other embodiments, sacrificial handle portion 22 may be epitaxially grown. In some cases, the sacrificial handle portion is grown in the same process. In more embodiments, sacrificial handle portion 22 may be bonded through a wafer bonding method.

Figure 5:
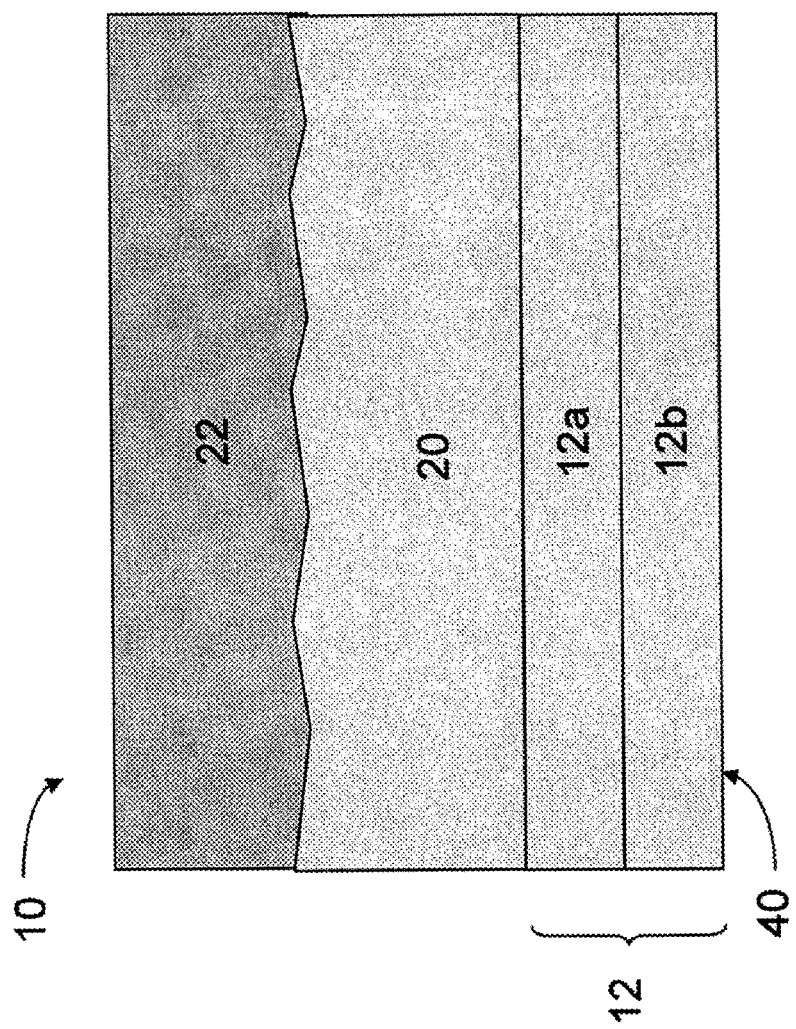
FIG. 5 is a schematic of gallium nitride material layers with the underlying region removed according to embodiments illustrated herein.

FIG. 5 includes a further process step where the substrate 16 as well as the buffer region 14 is removed and, as a result, an N-face surface 40 is exposed on the bottom layer. As shown in FIG. 5, the N-face surface is exposed on gallium nitride material region 12. As a result, further processing may subsequently occur on the N-face surface including formation of features such as layer(s) and/or contact(s).

Removal of the layers (e.g., substrate 16 and buffer region 14) underlying the gallium nitride material region to expose the N-face may be accomplished by any suitable technique. In some embodiments, these layers may be removed through mechanical removal methods. An example of layer removal through mechanical methods is through, for example, polishing or grinding techniques. In other embodiments, removal of these layers may occur through an etch process. In this respect, the etch process may include, but is not limited to, a wet chemical etch (e.g., acid, solvent). In further embodiments, etching may occur through dry etching, where a material is exposed to a bombardment of ions and/or a vapor/plasma phase etchant, which are used to dislodge portions of material from the surface. Dry etching also allows for directional or anisotropic etches to be performed. In some cases, certain layers may be selectively etched with respect to other layers. For example, AlGaN may be etched preferentially, relative to GaN, through the etch process by controlling plasma chemistry.

Figure 2C:
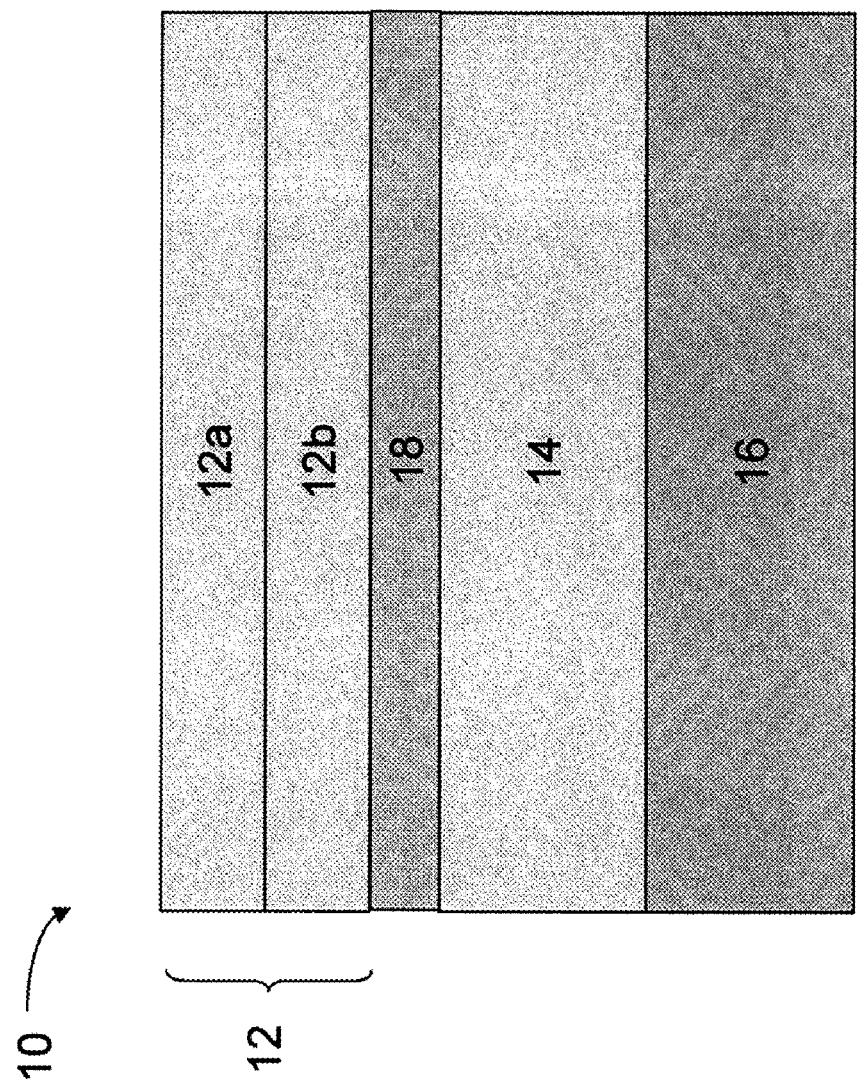
FIG. 2C is a schematic of gallium nitride material layers on a substrate with an etch stop between gallium nitride layers according to embodiments illustrated herein.

Additionally, an etch stop layer 18 may be included between gallium nitride material region 12 and buffer region 14, as embodied in FIG. 2C. In this regard, the etch stop layer 18 can serve to stop or limit etching of structure 10 from the backside during a subsequent processing step. However, it should be understood that not all embodiments include an etch stop layer, as shown in the embodiments depicted by FIGS. 2A and 2B.

In embodiments where an etch stop layer is incorporated, any suitable etch stop material may be used. The particular composition may depend on the etching conditions. In some cases, it may be desirable to etch away certain portions of material, but not others, for example, removal of AlGaN rather than GaN from a particular region, and vice versa at another region. Examples of suitable etch stop materials include III-nitride materials such as AlN, $Al_xGa_{(1-x)}N$, and $In_yGa_{(1-y)}N$. In some embodiments, an etch stop layer may be replaced with a suitable dielectric layer. In other embodiments, an etch stop layer may be utilized as a dielectric. In some embodiments, the etch processing step may be controlled based on the detection of a species that may be created upon removal of a portion of material during etching. For example, the implanted regions 13 may facilitate such control. The etching may be stopped based on detection of implanted species, for example silicon, (e.g., as an effluent gas species) during the etch process. In this regard, the etch may be appropriately monitored and appropriately halted upon detection of the gas species that comprise the implanted species. For example, the etching process may be stopped upon detection of an amount of the implanted species which may be pre-determined. In some cases, stopping the etching process is based on a detection of a decrease, or an increase, in the amount of species detected. In some cases, stopping the etching process is based on a detection of a decrease in the amount of species to an undetectable amount.

In another example, regions in buffer region 14 may be doped (e.g., intentionally) with a species to facilitate etching control. Species may be doped by any suitable method, such as for example, growing a doped species to form a portion of the buffer region. In this regard, etching may be stopped based upon whether or not the presence of a doped species is detected, for example Si, Mg, or Fe (e.g., as an effluent gas species). As the presence of the doped species is appropriately monitored during etching, when the concentration of doped species reduces by a pre-determined amount, etching may be appropriately halted. In some embodiments, etching continues as long as the presence of the doped species is detected. For example, the etching process may be stopped upon detection of an amount of the doped species which may be pre-determined. In some cases, stopping the etching process is based on a detection of a decrease, or an increase, in the amount of doped species detected. In some cases, stopping the etching process is based on a detection of a decrease in the amount of doped species to an undetectable amount.

In another aspect, a timed etch may be provided during device fabrication. In this regard, as the rate of etching through the material can be known, accordingly, the etching process may be halted after a period of time, yielding a desired etch depth. In cases where an implant material is incorporated within the gallium nitride material region 12, based on the dosage and energy of implantation, a timed etch may serve to suitably expose the gallium nitride material region, as appropriately desired, for device fabrication.

It can be appreciated that any combination of various etch techniques as well as techniques for controlling and/or halting the etch process may be utilized, as presented herein or otherwise known by those of ordinary skill in the art.

In some embodiments, removing the underlying regions (e.g., substrate and buffer region) may expose an N-face in the remaining gallium nitride material region 12. For example, substrate 16 and buffer region 14 are removed, leaving an N-face surface 40 of the gallium nitride material region 12 exposed. In this regard, further device processing may occur on the N-face surface 40 that is exposed from removal of the underlying region. As described previously, removal of the underlying region may occur by any appropriate process, including, for example but not limited to, an etch step and/or a mechanical removal process.

It should be understood that a portion of the gallium nitride material region may also be removed when exposing the N-face of the gallium nitride material region.

In some cases, buffer region 14 may include regions that have a relatively high density of defects, contributing to undesirable device performance (e.g., leakage). By removing the buffer region, leakage resulting from a high density of defects may be reduced.

In some embodiments, the thickness of the layer 12*b* (e.g., gallium nitride channel layer) may be tailored independently of the layer 12*a* (e.g., AlGaN barrier layer) for specific device performance. Such performance may be defined by the channel access length. In this regard, for high frequency devices, optimization may occur without any need to change the thickness of the AlGaN barrier region 12*a*, or alternatively, without any need to form a recess etch for a gate region of the device.

As discussed, in some cases, the thickness of GaN channel layer (e.g., layer 12*b*) may be tailored according to device performance independent of the AlGaN barrier layer (e.g., layer 12*a*). In particular, regarding device fabrication of a transistor, the thickness of the GaN channel layer may relate to the voltage potential difference required for activation of a gate. In this regard, for high speed devices, it may be desirable for the GaN channel layer to be thinner so that voltage potential differences for gate activation are decreased.

In another aspect, the AlGaN barrier layer (e.g., layer 12*a*) may offer further electron confinement by acting as a back barrier, as the AlGaN bandgap is wider in comparison to the bandgap of the GaN channel region. Typically, once electrons migrate to GaN region(s), due to a small bandgap, leakage may occur of electrons from the GaN region(s), resulting in an artificial voltage potential drop. As a result of such electron leakage, it becomes more difficult to reach the transition threshold for a device, such as for example, a gate included in a transistor. Once AlGaN is incorporated as a back side barrier, the improved electron confinement to the interface of first and second gallium nitride material layers 12*a* and 12*b* may result in the lessening of electron leakage below the depletion region.

Figure 6:
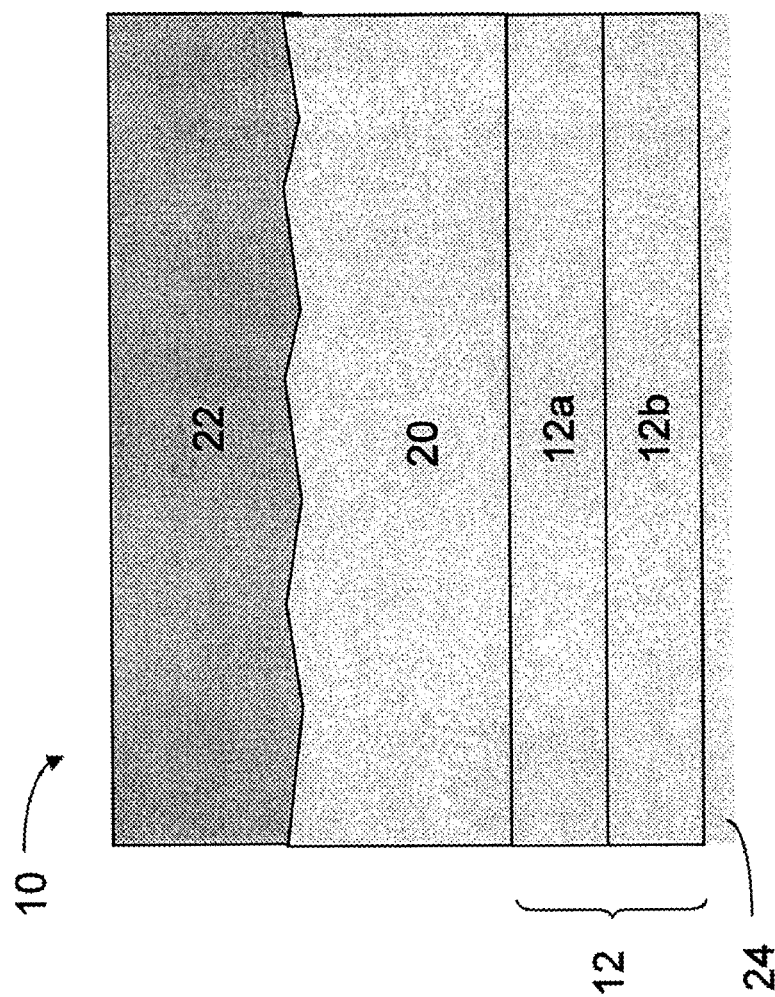
FIG. 6 is a schematic of a passivation layer deposited on a gallium nitride material layer according to embodiments illustrated herein.

A feature, such as a layer 24, may be formed on the exposed N-face surface 40, as depicted in FIG. 6. It should be understood that more than one layer, or other types of features such as contacts, may be formed on the surface.

In some embodiments, the layer may be a passivating layer. The passivation layer may be formed from any suitable passivation material, such as, but not limited to, silicon nitride. In other embodiments, layer 24 may comprise a gallium nitride material. In these cases, the thickness of the gallium nitride material may be effectively tailored to suit the device.

In some embodiments, an additional AlGaN region (not shown) may be incorporated in the device structure, forming a double heterostructure. In this regard, the GaN channel layer may be sandwiched between two regions of AlGaN. Leakage may be reduced as additional AlGaN barriers are provided on either side of the GaN channel.

Figure 7:
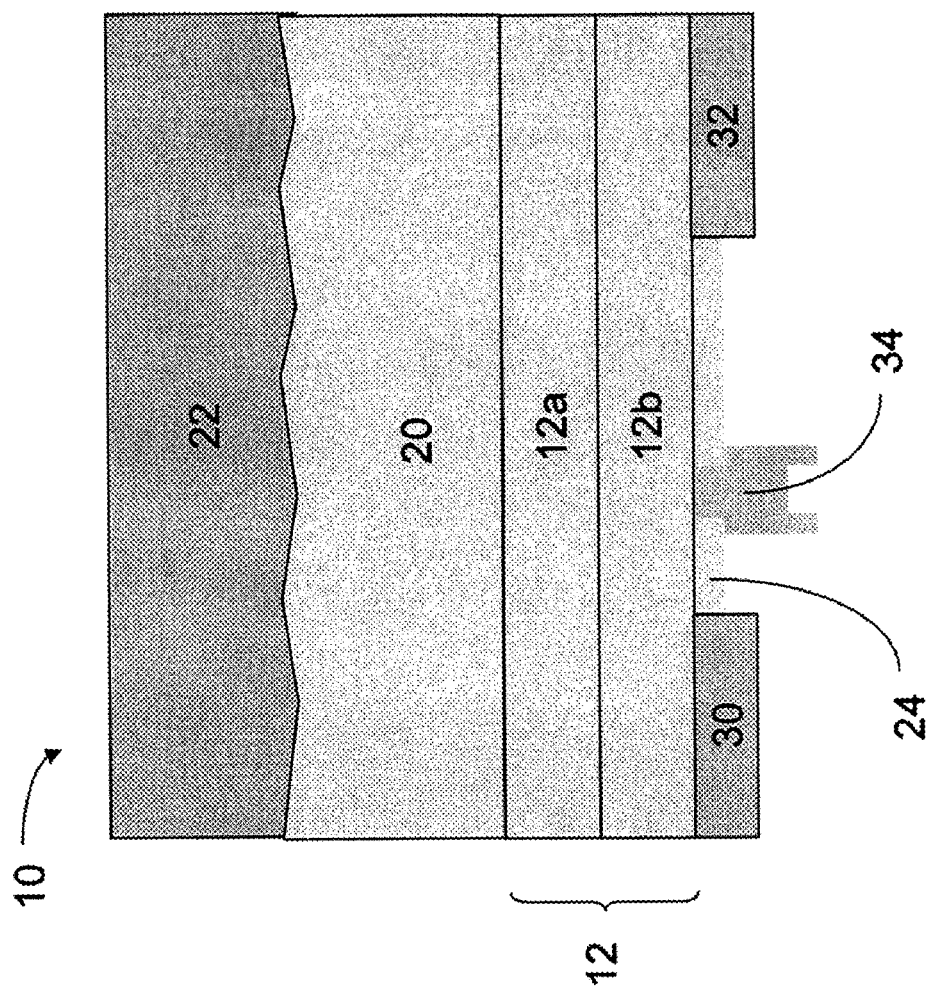
FIG. 7 is a schematic of a device formed on a gallium nitride material layer according to embodiments illustrated herein.

As shown in FIG. 7, additional steps of device processing may subsequently occur. For example, one or more contacts may be formed by any appropriate method. In some cases, ohmic contacts 30 and 32 are formed which function as source and drain contacts for the resulting device. A gate contact 34 may also be formed by any suitable technique. It should be understood that one or more contacts may be formed directly on the exposed N-face of the gallium nitride material region, or one or more intervening layers may be present. When the layer 24 is present, it may be etched, for example, to form recesses in which one or more contacts are formed.

In the embodiment illustrated, electrons may migrate from ohmic contact 32 toward the interface of AlGaN barrier region 12*a* and GaN channel region 12*b*, and subsequently back to ohmic contact 30, or vice versa, during use. In some cases, a two-dimensional electron gas may be present at the AlGaN/GaN interface.

In one aspect, the depth below gate contact 34 may be related to the voltage required for the gate to be opened or closed. In this respect, as discussed previously, the thickness of GaN channel (e.g., layer 12*b*) may relate to the voltage required for gate activation. In some cases, a $-1.25$ voltage potential difference is required to activate the gate, which can be a significant improvement over other conventional devices, where the voltage potential difference required to activate the gate can be $-3$ V to $-5$ V. In some embodiments, a recessed etch may be provided in fabrication of the device in order for the device to operate quicker, yet providing a relatively thin GaN channel layer may serve a similar purpose in this regard. Indeed, it may be possible to provide both a relatively thin GaN channel layer along with a recessed etch for device fabrication, allowing for even faster device operation.

As described previously, for some embodiments where an etch stop layer is included, a recess etch gate (not shown) may optionally be formed through an Al-based etch stop layer. In this respect, a recess etch gate may be appropriate for development of high frequency devices. Suitable contacts and related processes have been described in U.S. Pat. No. 7,071,498 which is incorporated herein by reference in its entirety. Any suitable device may be formed, such as, for example, a transistor (e.g., FET, JFET, enhancement mode FET).

Figure 8:
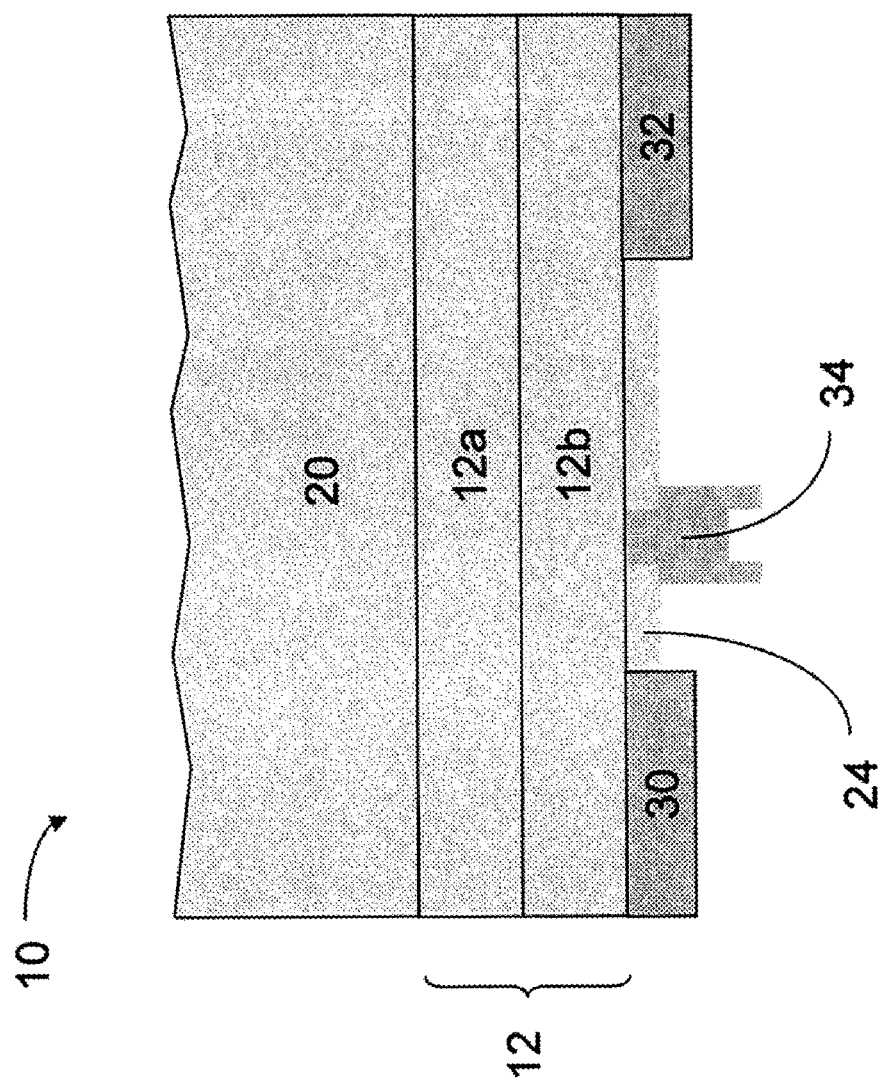
FIG. 8 is a schematic of a device on gallium nitride material layers with a sacrificial handle portion removed according to embodiments illustrated herein.

FIG. 8 depicts a further process step where the sacrificial handle portion 22 is removed. In some embodiments, some, or all, of handle 20 may be removed along with the sacrificial handle portion 22. In this respect, if the handle is also removed with the sacrificial handle portion 22, a flange 50 would be directly bonded to gallium nitride material region 12. The sacrificial handle portion 22 can be removed by any suitable method, including, for example, an etch and/or through mechanical removal, such as, for example, polishing/grinding techniques.

Figure 9:
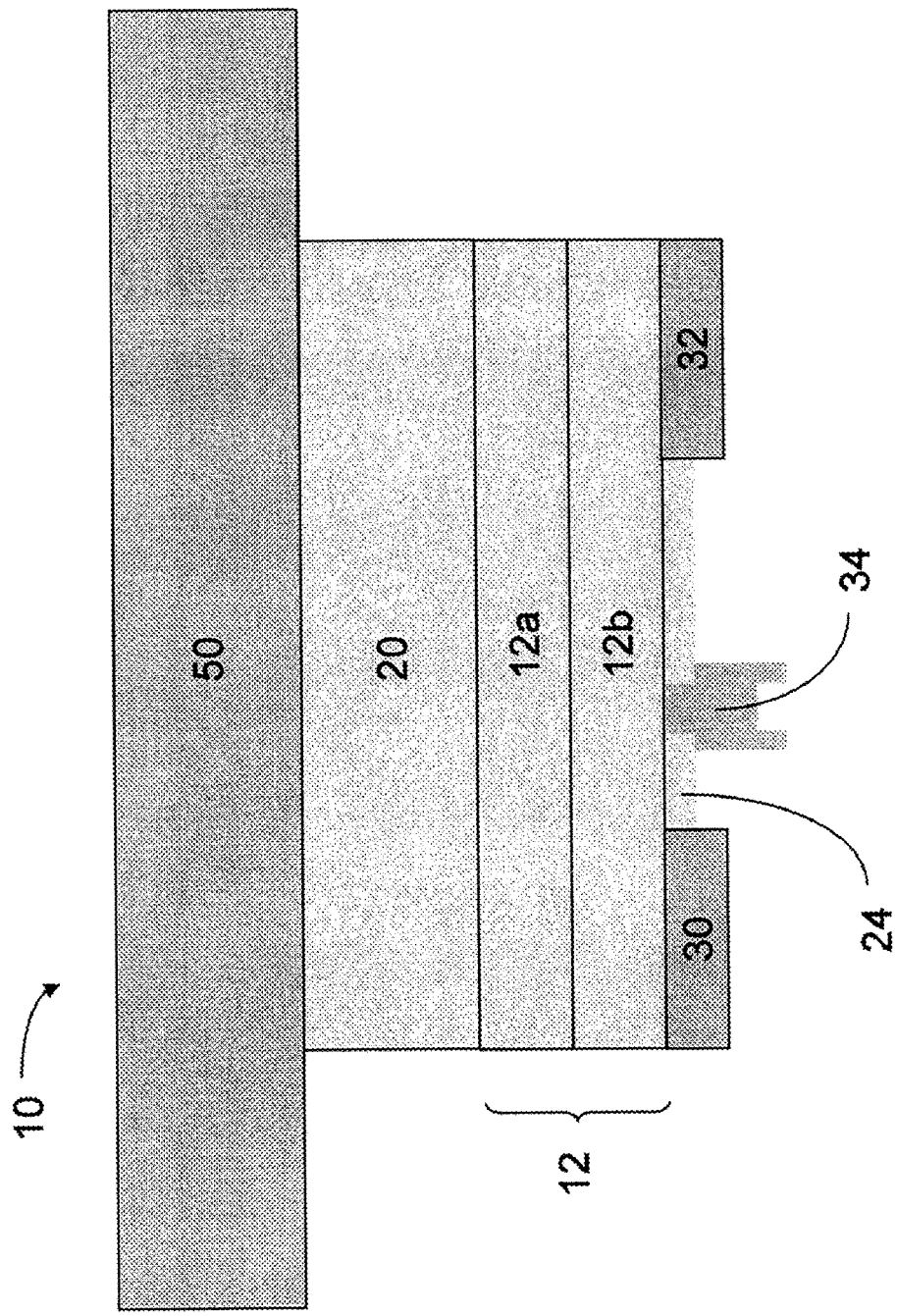
FIG. 9 is a schematic of a flange added on a handle according to embodiments illustrated herein.

Once sacrificial handle portion 22 is removed, a flange 50 may be attached to the device, as shown in FIG. 9. Subsequently, a chip may also be provided for the device. In some cases, the material of handle 20 may provide balanced stress levels so that the layered structure provides a sufficiently flat surface for bonding into a package. Attachment of the flange and chip may occur by any appropriate technique known in the art. The flange may be made of any suitable material including metals such as copper, copper molybdenum, copper tungsten, and/or alloys thereof, diamond, composites, plastics. Intermediate attachment materials may also be incorporated, providing for electrical conductivity as well as mechanical stability, such as, for example, gold-tin, gold-silicon, epoxy, and/or other suitable materials.

The semiconductor device structure illustrated in FIG. 9 may be further processed into a variety of semiconductor devices including devices described in commonly-owned U.S. Pat. No. 7,071,498 which is incorporated herein by reference and is based on commonly-owned, co-pending U.S. patent application Ser. No. 10/740,376, filed on Dec. 17, 2003, and entitled "Gallium Nitride Material Devices Including an Electrode-Defining Layer and Methods of Forming the Same". Suitable devices include, but are not limited to, electronic devices including transistors (e.g., FETs), SAW devices, and sensors; as well as, light-emitting devices including LEDs and laser diodes. The devices have active regions that are typically, at least in part, within the gallium nitride material region 12. Also, the devices include a variety of other functional layers and/or features (e.g., electrodes).

In some embodiments, devices formed may advantageously include a very thin gallium nitride material region 12. For example, the gallium nitride material region may have an overall thickness of between 10-50 nm; or, between 10-25 nm. In these embodiments, the device may not include any other gallium nitride material region. That is, the only gallium nitride material region present in the device may have these thicknesses. In this regard, gallium nitride material regions, as presented herein, may have thicknesses that are substantially less than that of conventional designs.

In some embodiments, the first gallium nitride material layer 12a may be a barrier layer formed from aluminum gallium nitride. In further embodiments, the second gallium nitride material layer 12b may be a channel layer formed from gallium nitride. In these embodiments, the GaN channel layer may have a thickness of 5-1000 nm. In other embodiments, the GaN channel layer may have a thickness of 10-100 nm. In further embodiments, the GaN channel layer may have a thickness of 10-25 nm. The AlGaN barrier layer may exhibit a thickness of 5-1000 nm. In some embodiments, AlGaN barrier layer may exhibit a thickness of 10-100 nm. In some embodiments, AlGaN barrier layer may exhibit a thickness of 10-25 nm.

In some embodiments, the ratio between the thicknesses of the GaN channel layer and the AlGaN barrier layer is less than 100. In other embodiments, the ratio between the thicknesses of the GaN channel layer and the AlGaN barrier layer is less than 10. In some embodiments, the ratio between the thicknesses of the GaN channel layer and the AlGaN barrier layer is less than 5. In further embodiments, the ratio between the thicknesses of the GaN channel layer and the AlGaN barrier layer is less than 1. In other embodiments, the ratio between the thicknesses of the GaN channel layer and the AlGaN barrier layer is less than 0.5.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A method of forming a gallium nitride material device structure comprising;
    forming a gallium nitride material region comprising first and second gallium nitride material layers, the second gallium nitride material layer situated between the first gallium nitride material layer and an underlying region, the underlying region comprising a buffer region;
    forming an implanted region, at least in part, within the first gallium nitride material layer;
    removing at least a portion of the underlying region to expose an N-face of the gallium nitride material region; and
    forming a feature on the N-face of the gallium nitride material region;
    wherein a portion of the gallium nitride material region is removed when exposing the N-face of the gallium nitride material region.

2. The method of claim 1, wherein forming a feature comprises forming a layer on the N-face of the gallium nitride material region.

3. The method of claim 1, wherein forming a feature comprises forming a contact on the N-face of the gallium nitride material region.

4. The method of claim 3, further comprising forming a source contact, a gate contact and a drain contact on the N-face of the gallium nitride material region.

5. The method of claim 1, wherein the underlying region comprises a substrate.

6. The method of claim 5, wherein the substrate comprises silicon.

7. The method of claim 1, wherein the gallium nitride material region comprises a gallium nitride channel layer.

8. The method of claim 7, wherein the N-face of the gallium nitride channel layer is exposed.

9. The method of claim 1, wherein the underlying region is removed by etching to expose an N-face of the gallium nitride material region.

10. The method of claim 1, wherein the buffer region is removed when exposing the N-face of the gallium nitride material region.

11. The method of claim 1, further comprising forming a handle region on the gallium nitride material region.

12. The method of claim 11, wherein the handle region includes a sacrificial handle portion.

13. The method of claim 12, wherein the sacrificial handle portion comprises silicon.

14. The method of claim 1, wherein the gallium nitride material region comprises an aluminum gallium nitride layer.

15. The method of claim 1, further comprising forming another implanted region, at least in part, within the gallium nitride material region.

16. The method of claim 1, further comprising stopping removal of the underlying region based on detection of implanted species from the implanted region.

17. A method comprising:
    introducing a species within a structure comprising a gallium nitride material region and a region underlying the gallium nitride material region, the region underlying the gallium nitride material region comprising a buffer region, the gallium nitride material region comprising a first gallium nitride material layer and a second gallium nitride material layer, the second gallium nitride material layer situated between the first gallium nitride material layer and the buffer region, the species introduced at least into a portion of the first gallium nitride material layer;
    removing a portion of the structure including the region underlying the gallium nitride material region to expose an N-face of the gallium nitride material region; and
    stopping removal of the structure based on detecting an amount of the introduced species.

18. The method of claim 17, wherein the introduced species is a dopant within the gallium nitride material region.

19. The method of claim 18, wherein the introduced species is included in the buffer region.

20. The method of claim 17, wherein a portion of the gallium nitride material region is removed.

21. The method of claim 17, wherein removing the portion comprises etching.

22. The method of claim 17, wherein stopping removal of the structure is based on detection of a pre-determined amount of the species.

23. The method of claim 17, wherein stopping removal of the structure is based on a detection of a decrease in the amount of species detected.

24. The method of claim 23, stopping removal of the structure is based on a detection of a decrease in the amount of species to an undetectable amount.

25. The method of claim 17, wherein the species is silicon.

26. The method of claim 18, wherein the species is magnesium.

27. The method of claim 18, wherein the species is iron.

* * * * *